(12) United States Patent
Asuri (10) Patent No.: US 9,154,240 B2
(45) Date of Patent: Oct. 6, 2015

(54) PRECISION POWER/PEAK DETECTOR USING ON-CHIP REFERENCE POWER SOURCE

(75) Inventor: Bhushan Shanti Asuri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 225 days.

(21) Appl. No.: 13/587,604

(22) Filed: Aug. 16, 2012

(65) Prior Publication Data

US 2013/0217339 A1 Aug. 22, 2013

Related U.S. Application Data (60) Provisional application No. 61/525,054, filed on Aug. 18, 2011.

(51) Int. Cl.
*H04B 17/00* (2015.01)
*H04B 17/10* (2015.01)
*H04B 17/14* (2015.01)
*H03G 3/30* (2006.01)

(52) U.S. Cl.
CPC ............ *H04B 17/003* (2013.01); *H04B 17/101* (2015.01); *H04B 17/14* (2015.01); *H03G 3/3042* (2013.01)

(58) Field of Classification Search
USPC ......... 455/73, 91, 114.1–114.3, 115.1–115.3, 455/126, 127, 127.1–127.4, 226.1; 330/129, 149
See application file for complete search history.

(56) References Cited

U.S. PATENT DOCUMENTS

| 6,128,477 | A  | * | 10/2000 | Freed ........................ 455/115.1 |
| 7,567,788 | B2 |   | 7/2009  | Newton et al. |
| 7,853,229 | B2 |   | 12/2010 | Maulik et al. |
| 7,890,132 | B2 |   | 2/2011  | Chien et al. |
| 7,937,049 | B2 | * | 5/2011  | Phillips et al. ............. 455/114.3 |
| 8,027,642 | B2 |   | 9/2011  | Proctor, Jr. et al. |
| 8,210,440 | B1 | * | 7/2012  | Pinai ............................ 235/494 |
| 2002/0175751 | A1 | * | 11/2002 | McMorrow ................... 330/129 |
| 2009/0067351 | A1 |   | 3/2009  | Wiesbauer et al. |
| 2012/0068774 | A1 |   | 3/2012  | Chen et al. |

FOREIGN PATENT DOCUMENTS

| WO | 02095931 A2 | 11/2002 |
| WO | 2009020622 A1 | 2/2009 |

OTHER PUBLICATIONS

International Search Report and Written Opinion—PCT/US2012/051625, International Search Authority—European Patent Office—Oct. 29, 2012.

* cited by examiner

Primary Examiner — Thanh Le (57) ABSTRACT

A wireless device is described. The wireless device includes a high precision power/peak detector. The wireless device also includes a reference signal source. The high precision power/peak detector and the reference signal source are on an integrated circuit. The reference signal source provides a precision reference signal used to calibrate the high precision power/peak detector.

36 Claims, 8 Drawing Sheets

PRECISION POWER/PEAK DETECTOR USING ON-CHIP REFERENCE POWER SOURCE

RELATED APPLICATIONS

This application is related to and claims priority from U.S. Provisional Patent Application Ser. No. 61/525,054, filed Aug. 18, 2011, for "PRECISION POWER DETECTOR," which is incorporated herein by reference.

TECHNICAL FIELD

The present disclosure relates generally to electronic devices for communication systems. More specifically, the present disclosure relates to systems and methods for a precision power/peak detector using an on-chip reference power source.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

These electronic devices may communicate wirelessly with each other and with a network. It may be desirable for an electronic device to maximize battery life. Because an electronic device often runs on a battery with a limited operation time, reductions in the power consumption of an electronic device may increase the desirability and functionality of the electronic device.

The electronic devices have also become smaller and cheaper. To facilitate both the decrease in size and the decrease in cost, additional circuitry and more complex circuitry are being used on integrated circuits. Thus, any reduction in the die area used by circuitry may reduce both the size and cost of an electronic device. Benefits may be realized by improvements to electronic devices that allow an electronic device to participate in carrier aggregation while minimizing the cost and size of the electronic device while also minimizing the power consumption of the electronic device.

SUMMARY

A wireless device is described. The wireless device includes a high precision power/peak detector. The wireless device also includes a reference signal source. The high precision power/peak detector and the reference signal source are on an integrated circuit. The reference signal source provides a precision reference signal used to calibrate the high precision power/peak detector.

The integrated circuit may be a radio frequency integrated circuit. The wireless device may also include a power amplifier. The wireless device may further include a coupler. The coupler may be coupled to an output of the power amplifier. The coupler may provide a feedback signal to the high precision power/peak detector. The precision reference signal may be provided to the high precision power/peak detector via a reference signal switch.

The high precision power/peak detector may be calibrated to measure absolute power at an input. The precision reference signal may be independent of process, temperature and frequency. The high precision power/peak detector may be used to detect an output power of the integrated circuit and/or to detect a rejection of a duplexer on the wireless device in a Rx band. The high precision power/peak detector may also be used to detect a rejection of a power amplifier on the wireless device in a Rx band and/or to predict Rx band noise at an input of a low noise amplifier on the wireless device.

The high precision power/peak detector may be used to modify a configuration of the wireless device to enable lower current consumption of the wireless device. The high precision power/peak detector may be calibrated by setting the wireless device to a maximum power and measuring a feedback signal using the high precision power/peak detector and a housekeeping analog-to-digital converter. The wireless device may be a wireless communication device or a base station.

A method for measuring power on a wireless device is also described. A reference signal switch is adjusted to provide a precision reference signal to a high precision power/peak detector. The precision reference signal is generated by a reference signal source. The reference signal source and the high precision power/peak detector are located on an integrated circuit. The high precision power/peak detector is calibrated using the precision reference signal. A feedback signal is measured using the high precision power/peak detector.

The reference signal switch may be adjusted to stop providing the precision reference signal to the high precision power/peak detector. A transmit chain feedback switch may be adjusted to provide transmit chain feedback from the high precision power/peak detector to a transmit chain. The transmit chain may be optimized based on the transmit chain feedback.

Measuring a feedback signal may include generating a transmit signal. Measuring a feedback signal may also include amplifying the transmit signal using a power amplifier. Measuring a feedback signal may further include providing a feedback signal to the high precision power/peak detector. Measuring a feedback signal may also include obtaining transmit chain metrics using the high precision power/peak detector.

An apparatus is also described. The apparatus includes means for adjusting a reference signal switch to provide a precision reference signal to a high precision power/peak detector. The precision reference signal is generated by a reference signal source. The reference signal source and the high precision power/peak detector are located on an integrated circuit. The apparatus also includes means for calibrating the high precision power/peak detector using the precision reference signal. The apparatus further includes means for measuring a feedback signal using the high precision power/peak detector.

A computer-program product for measuring power on a wireless device is also described. The computer-program product includes a non-transitory computer-readable medium having instructions thereon. The instructions include code for causing the wireless device to adjust a reference signal switch to provide a precision reference signal to a high precision power/peak detector. The precision reference signal is generated by a reference signal source. The reference signal source and the high precision power/peak detector are located on an integrated circuit. The instructions also include code for causing the wireless device to calibrate the high precision power/peak detector using the precision reference signal. The instructions further include code for causing the wireless device to measure a feedback signal using the high precision power/peak detector.

DETAILED DESCRIPTION

Figure 1:
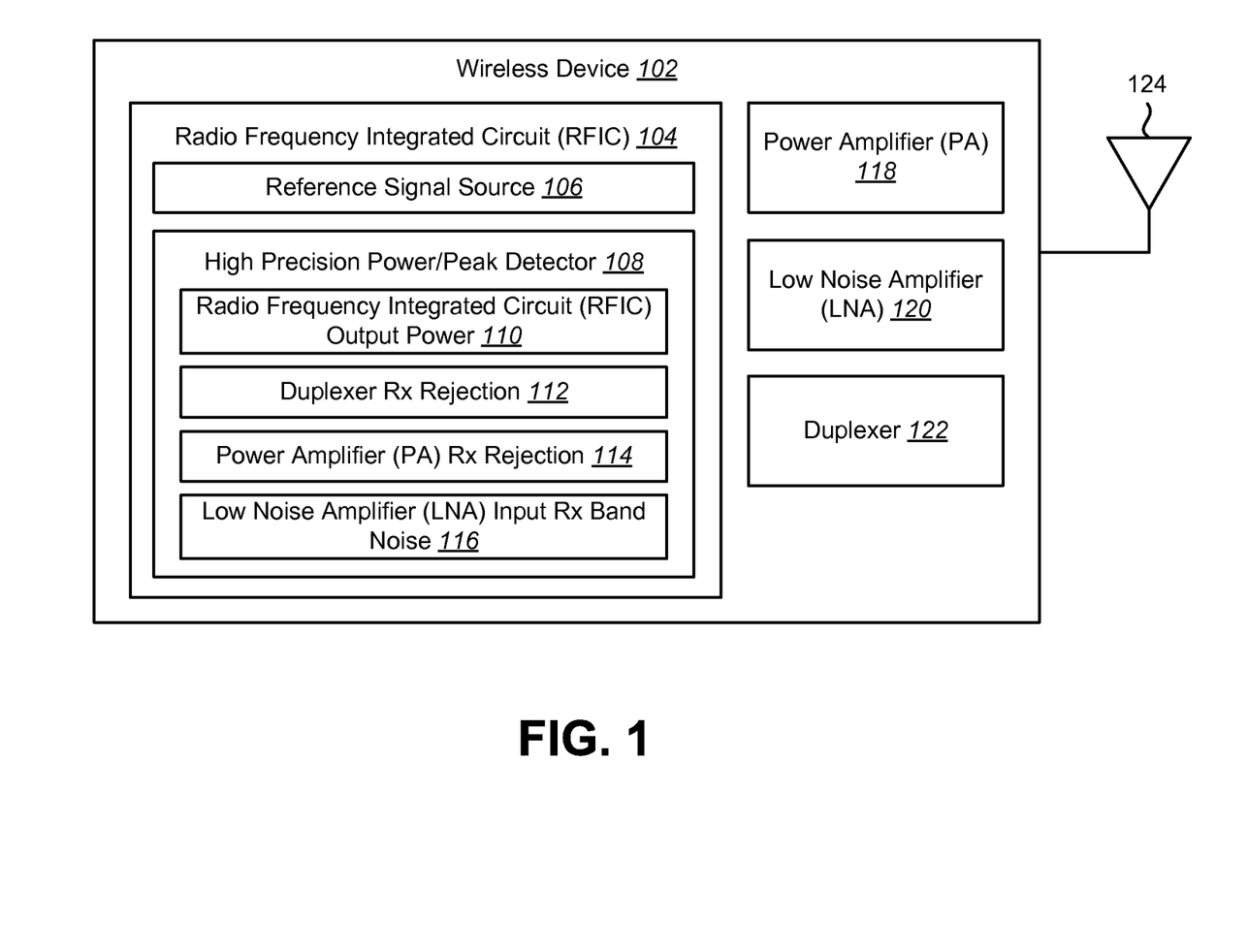
FIG. 1 is a block diagram illustrating a wireless device that includes a high precision power/peak detector.

FIG. 1 is a block diagram illustrating a wireless device 102 that includes a high precision power/peak detector 108. The high precision power/peak detector 108 may be calibrated using an internal reference signal source 106. The wireless device 102 may be a wireless communication device or a base station.

A wireless communication device may also be referred to as, and may include some or all of the functionality of, a terminal, an access terminal, a user equipment (UE), a subscriber unit, a station, etc. A wireless communication device may be a cellular phone, a personal digital assistant (PDA), a wireless device, a wireless modem, a handheld device, a laptop computer, a PC card, compact flash, an external or internal modem, a wireline phone, etc. A wireless communication device may be mobile or stationary. A wireless communication device may communicate with zero, one or multiple base stations on a downlink and/or an uplink at any given moment. The downlink (or forward link) refers to the communication link from a base station to a wireless communication device, and the uplink (or reverse link) refers to the communication link from a wireless communication device to a base station. Uplink and downlink may refer to the communication link or to the carriers used for the communication link.

A wireless communication device may operate in a wireless communication system that includes other wireless devices 102, such as base stations. A base station is a station that communicates with one or more wireless communication devices. A base station may also be referred to as, and may include some or all of the functionality of, an access point, a broadcast transmitter, a Node B, an evolved Node B, etc. Each base station provides communication coverage for a particular geographic area. A base station may provide communication coverage for one or more wireless communication devices. The term "cell" can refer to a base station and/or its coverage area, depending on the context in which the term is used.

Communications in a wireless communication system (e.g., a multiple-access system) may be achieved through transmissions over a wireless link. Such a communication link may be established via a single-input and single-output (SISO) or a multiple-input and multiple-output (MIMO) system. A multiple-input and multiple-output (MIMO) system includes transmitter(s) and receiver(s) equipped, respectively, with multiple (NT) transmit antennas and multiple (NR) receive antennas for data transmission. SISO systems are particular instances of a multiple-input and multiple-output (MIMO) system. The multiple-input and multiple-output (MIMO) system can provide improved performance (e.g., higher throughput, greater capacity or improved reliability) if the additional dimensionalities created by the multiple transmit and receive antennas are utilized.

The wireless communication system may utilize both single-input and multiple-output (SIMO) and multiple-input and multiple-output (MIMO). The wireless communication system may be a multiple-access system capable of supporting communication with multiple wireless communication devices by sharing the available system resources (e.g., bandwidth and transmit power). Examples of such multiple-access systems include code division multiple access (CDMA) systems, wideband code division multiple access (W-CDMA) systems, time division multiple access (TDMA) systems, frequency division multiple access (FDMA) systems, orthogonal frequency division multiple access (OFDMA) systems, single-carrier frequency division multiple access (SC-FDMA) systems, 3rd Generation Partnership Project (3GPP) Long Term Evolution (LTE) systems and spatial division multiple access (SDMA) systems.

The wireless device 102 may be used for both the transmission of wireless signals and the reception of wireless signals. Thus, the wireless device 102 may include a transmit (Tx) chain and a receive (Rx) chain. The transmit (Tx) chain may route signals generated by a modem through a transmitter to be transmitted by an antenna 124. Likewise, the receive (Rx) chain may route signals received by an antenna 124 through a receiver to be decoded by a modem. Portions of the receive (Rx) chain and the transmit (Tx) chain may be located on a printed circuit board (PCB) in the wireless device 102. In one configuration, portions of the receive (Rx) chain and the transmit (Tx) chain may be located on an integrated circuit on the printed circuit board (PCB) (referred to as a radio frequency integrated circuit (RFIC) 104).

The radio frequency integrated circuit (RFIC) 104 may include a reference signal source 106 and a high precision power/peak detector 108. The reference signal source 106 may generate a precision power reference signal for calibrating the high precision power/peak detector 108. The reference signal source 106 is discussed in additional detail below in relation to FIG. 6.

The high precision power/peak detector 108 may be used to detect key characteristics of the transmit (Tx) chain (referred to as transmit (Tx) chain metrics) in the wireless device 102. For example, the high precision power/peak detector 108 may be used to determine a radio frequency integrated circuit (RFIC) output power 110, a duplexer Rx rejection 112, a power amplifier (PA) Rx rejection 114 and a low noise amplifier (LNA) input Rx band noise 116. The transmit (Tx) chain metrics may be used to optimize the operations of the wireless device 102.

The wireless device 102 may also include a power amplifier (PA) 118, a low noise amplifier (LNA) 120 and a duplexer 122. The radio frequency integrated circuit (RFIC) output power 110 may refer to the power output by the radio frequency integrated circuit (RFIC) 104 to the power amplifier (PA) 118. The duplexer Rx rejection 112 may refer to the rejection of Rx signals in the duplexer 122 (e.g., the amount of Rx signal that is bled onto a Tx signal by the duplexer 122). The low noise amplifier (LNA) input Rx band noise 116 may refer to the noise that is provided to the low noise amplifier (LNA) 120 by the radio frequency integrated circuit (RFIC) 104.

Figure 2:
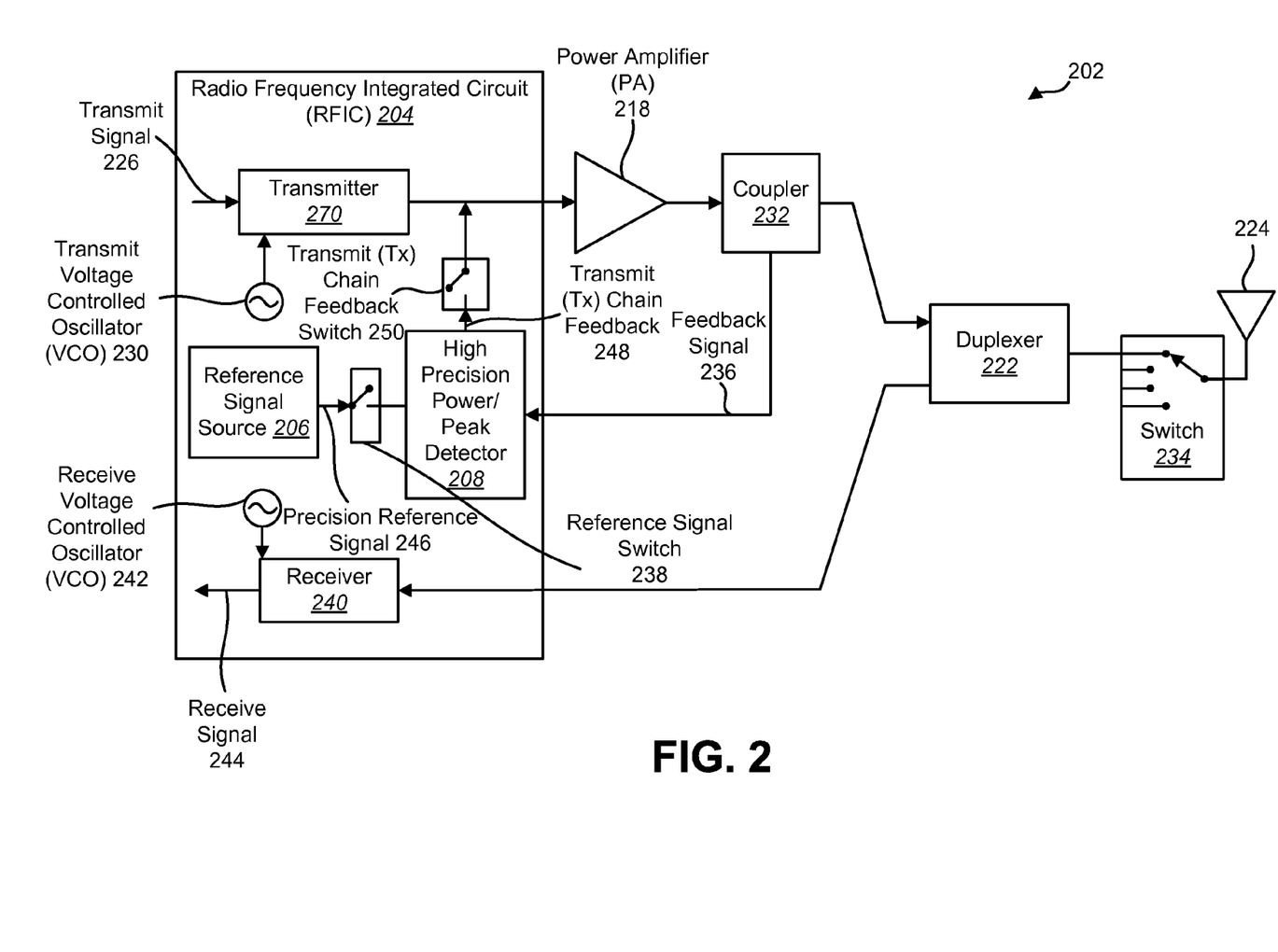
FIG. 2 is a block diagram illustrating another wireless device for use in the present systems and methods.

FIG. 2 is a block diagram illustrating another wireless device 202 for use in the present systems and methods. The wireless device 202 of FIG. 2 may be one configuration of the wireless device 102 of FIG. 1. The wireless device 202 may include a radio frequency integrated circuit (RFIC) 204, a power amplifier (PA) 218, a coupler 232, a duplexer 222, a switch 234 and an antenna 224.

The radio frequency integrated circuit (RFIC) 204 may include a transmitter 270 and a receiver 240. The transmitter 270 may receive a transmit signal 226 from a modem that is to be transmitted by the antenna 224. The transmitter 270 may be part of the transmit (Tx) chain. The receiver 240 may provide a receive signal 244 to the modem that was received by the antenna 224. The receiver 240 may be part of the receive (Rx) chain. The transmitter 270 may upconvert the transmit signal 226 to a transmit frequency using signals provided by a transmit voltage controlled oscillator (VCO) 230. Likewise, the receiver 240 may downconvert the receive signal 244 to baseband using signals provided by a receive voltage controlled oscillator (VCO) 242.

The output of the transmitter 270 may be coupled to the input of the power amplifier (PA) 218. The power amplifier (PA) 218 may not be located on the radio frequency integrated circuit (RFIC) 204. The output of the power amplifier (PA) 218 may be provided to a coupler 232. The coupler 232 may allow a portion of the signal output by the power amplifier (PA) 218 to be fed back to the radio frequency integrated circuit (RFIC) 204 as a feedback signal 236. The portion of the signal output by the power amplifier (PA) 218 that is not fed back to the radio frequency integrated circuit (RFIC) 204 may be provided to a duplexer 222. The duplexer 222 may allow bi-directional communications using a single antenna 224. The duplexer 222 may be coupled to the antenna 224 via a switch 234. The duplexer 222 may also be coupled to the receiver 240 on the radio frequency integrated circuit (RFIC) 204.

The radio frequency integrated circuit (RFIC) 204 may include a reference signal source 206 and a high precision power/peak detector 208. The reference signal source 206 may generate a precision reference signal 246 that is provided to the high precision power/peak detector 208 via a reference signal switch 238. The reference signal switch 238 may allow the high precision power/peak detector 208 to receive the precision reference signal 246 only during calibration. Precision power measurement using the high precision power/peak detector 208 may only be possible if there is a precision reference signal 246 for calibration. By placing the reference signal source 206 on the radio frequency integrated circuit (RFIC) 204, additional pins on the radio frequency integrated circuit (RFIC) 204 for receiving the precision reference signal 246 are not needed. In one configuration, the high precision power/peak detector 208 may be used to control the maximum power of the wireless device 202.

The high precision power/peak detector 208 may provide transmit (Tx) chain feedback 248 (such as the transmit (Tx) chain metrics discussed above) to the transmitter 270 via a transmit (Tx) chain feedback switch 250. For example, the high precision power/peak detector 208 may be used to detect the output power 110 of the radio frequency integrated circuit (RFIC) 204. Using a combination of tuning the transmitter 270 to transmit (Tx) and receive (Rx) frequencies, the high precision power/peak detector 208 may be used to detect the rejection 112 of the duplexer 222 in the receive (Rx) band and the rejection 114 of the power amplifier (PA) 218 in the receive (Rx) band. The output power 110 of the radio frequency integrated circuit (RFIC) 204, the duplexer Rx rejection 112 and the power amplifier (PA) Rx rejection 114 may be used together to precisely predict the receive (Rx) band noise 116 at the input of the low noise amplifier (LNA) 120. The receive (Rx) band noise 116 may be used by the radio frequency integrated circuit (RFIC) 204 to enable lower current consumption. One benefit of reduced current consumption is an increase in the battery life of the wireless device 202.

Figure 3:
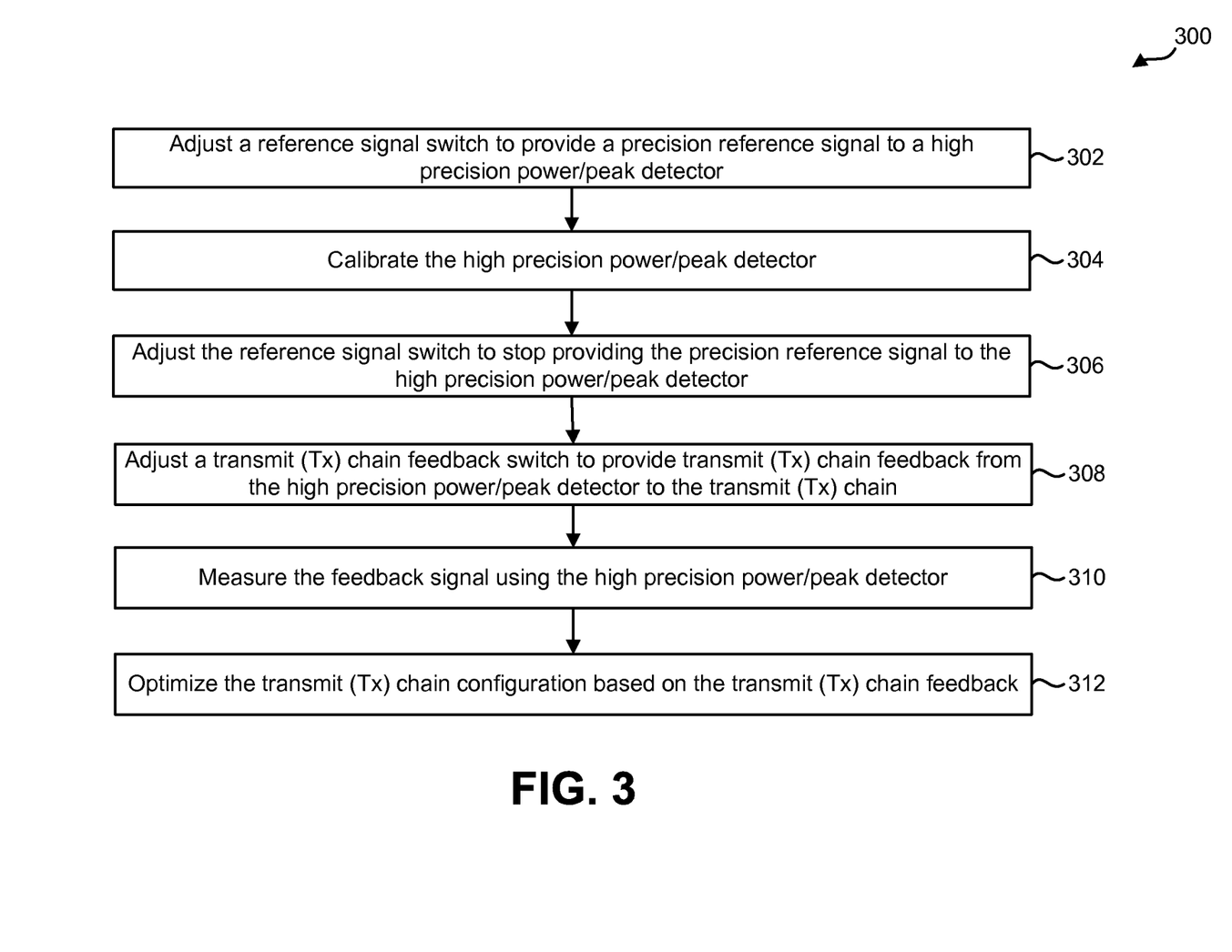
FIG. 3 is a flow diagram of a method for using a high precision power/peak detector on a radio frequency integrated circuit (RFIC)

FIG. 3 is a flow diagram of a method 300 for using a high precision power/peak detector 108 on a radio frequency integrated circuit (RFIC) 104. The method 300 may be performed by a wireless device 102. In one configuration, the wireless device 102 may be a wireless communication device or a base station. The wireless device 102 may include a radio frequency integrated circuit (RFIC) 104 that has both a reference signal source 106 and a high precision power/peak detector 108.

The wireless device 102 may adjust 302 a reference signal switch 238 to provide a precision reference signal 246 to the high precision power/peak detector 108. The wireless device 102 may calibrate 304 the high precision power/peak detector 108 using the precision reference signal 246. In one configuration, the high precision power/peak detector 108 may be calibrated by setting the wireless device 102 to a maximum power and measuring a reading on the high precision power/peak detector 108 using a house keeping analog-to-digital converter (ADC). The wireless device 102 may then adjust 306 the reference signal switch 238 to stop providing the precision reference signal 246 to the high precision power/peak detector 108.

The wireless device 102 may adjust 308 a transmit (Tx) chain feedback switch 250 to provide transmit (Tx) chain feedback 248 from the high precision power/peak detector 108 to the transmit (Tx) chain. The transmit (Tx) chain feedback 248 may include the Rx band noise 116, which can be used by the transmit (Tx) chain to enable lower current consumption by the wireless device 102. The wireless device 102 may measure 310 the feedback signal 236 using the high precision power/peak detector 208. The wireless device 102 may then optimize 312 the transmit (Tx) chain configuration based on the transmit (Tx) chain feedback 248.

Figure 4:
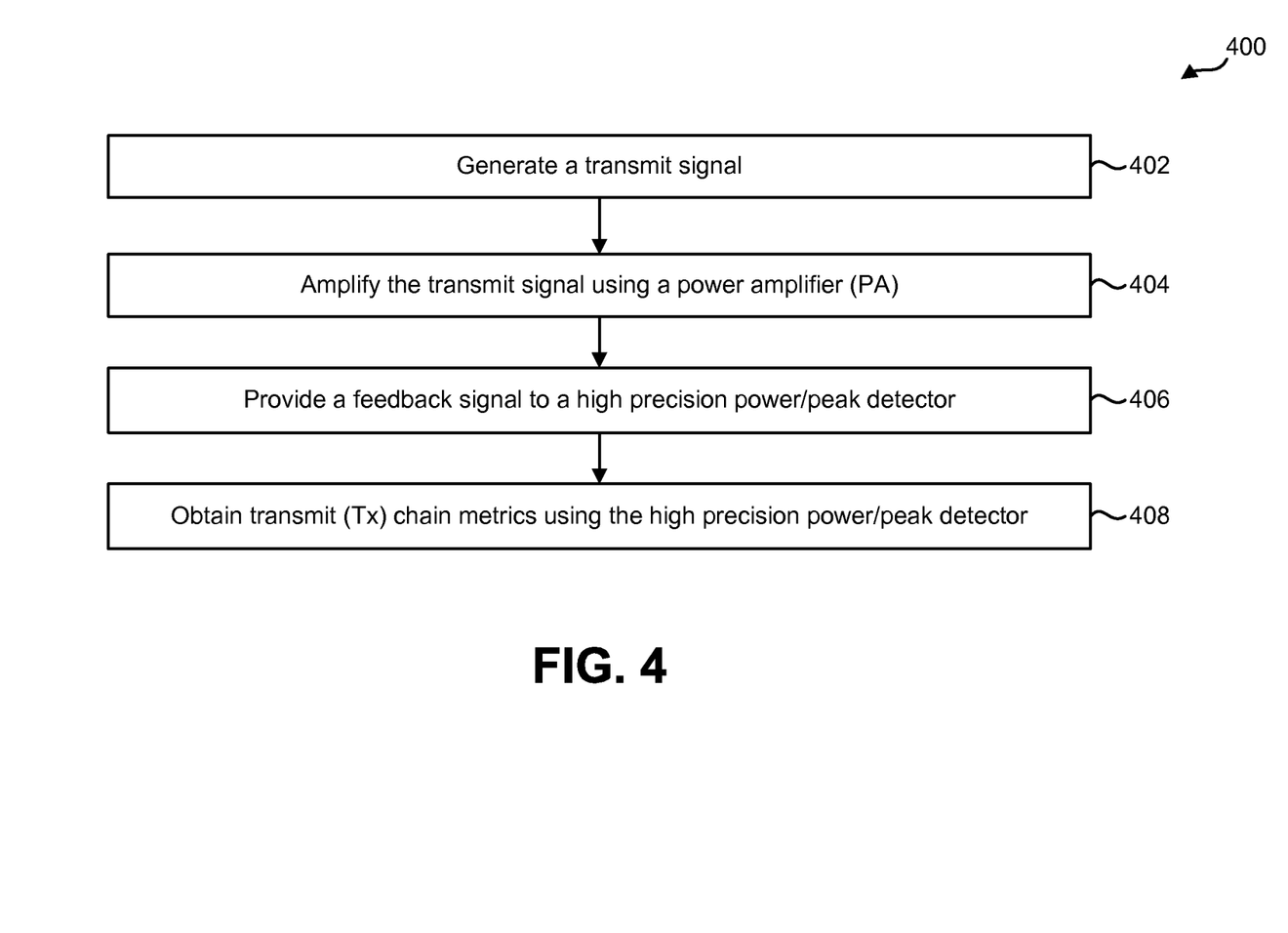
FIG. 4 is a flow diagram of a method for obtaining transmit (Tx) chain metrics.

FIG. 4 is a flow diagram of a method 400 for obtaining transmit (Tx) chain metrics. The method 400 may be performed by a wireless device 102. In one configuration, the wireless device 102 may be a base station or a wireless communication device. The wireless device 102 may include a radio frequency integrated circuit (RFIC) 104 that has both a reference signal source 106 and a high precision power/peak detector 108.

The wireless device 102 may generate 402 a transmit signal 226. In one configuration, the wireless device 102 may generate 402 the transmit signal 226 using a transmitter 270. The wireless device 102 may amplify 404 the transmit signal 226 using a power amplifier (PA) 118. The wireless device 102 may provide 406 a feedback signal 236 to the high precision power/peak detector 108. In one configuration, the feedback signal 236 may be provided to the high precision power/peak detector 108 using a coupler 232. The wireless device 102 may obtain 408 transmit (Tx) chain metrics using the high precision power/peak detector 108. For example, the wireless device 102 may obtain a low noise amplifier (LNA) input Rx band noise 116.

Figure 5:
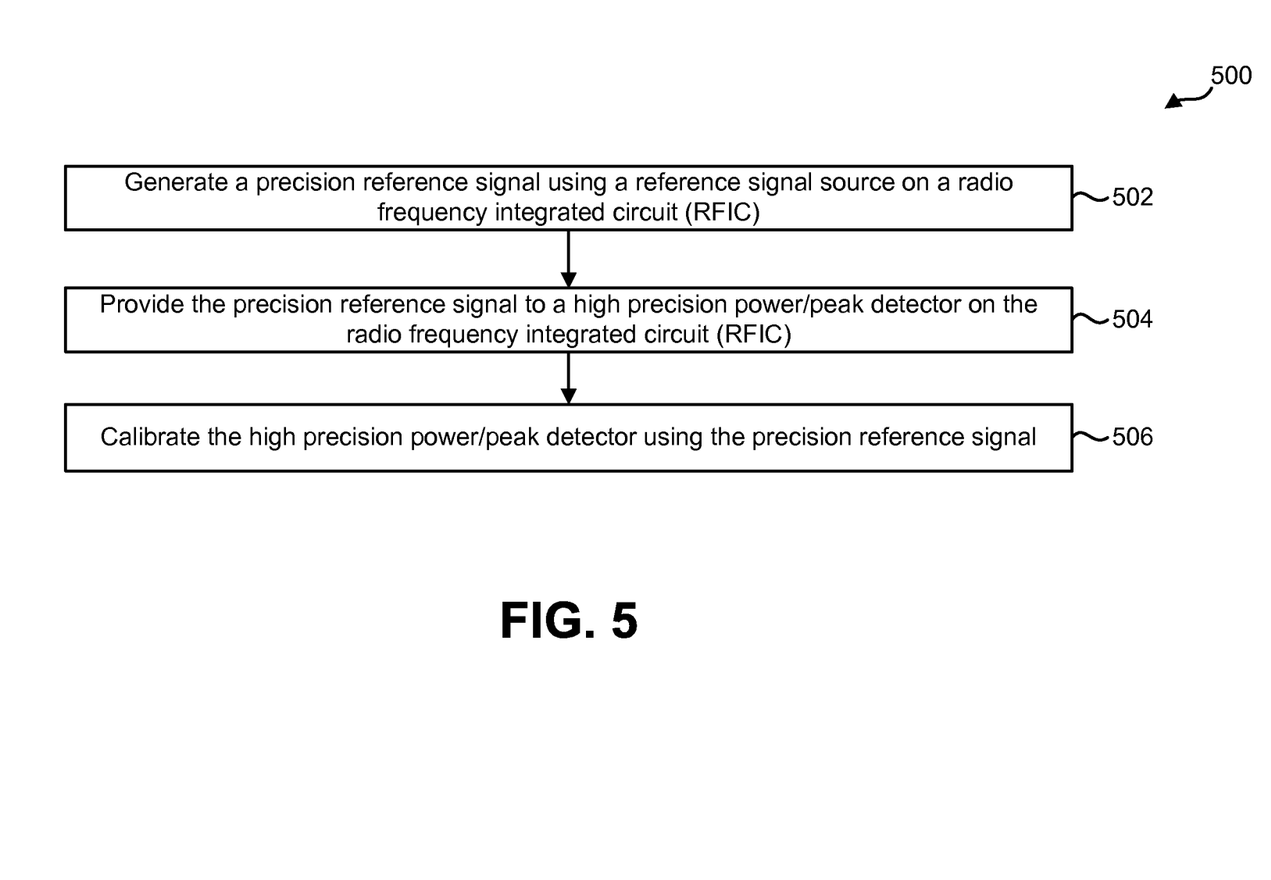
FIG. 5 is a flow diagram of a method for calibrating a high precision power/peak detector.

FIG. 5 is a flow diagram of a method 500 for calibrating a high precision power/peak detector 108. The method 500 may be performed by a wireless device 102. The wireless device 102 may be a wireless communication device or a base station. The wireless device 102 may include the high precision power/peak detector 108 and a reference signal source 106 that are both located on a radio frequency integrated circuit (RFIC) 104.

The wireless device 102 may generate 502 a precision reference signal 246 using the reference signal source 106 on the radio frequency integrated circuit (RFIC) 104. The wireless device 102 may provide 504 the precision reference signal 246 to the high precision power/peak detector 108 on the radio frequency integrated circuit (RFIC) 104. The wireless device 102 may calibrate 506 the high precision power/peak detector 108 using the precision reference signal 246. The high precision power/peak detector 108 may be calibrated to measure absolute power arriving at the input of the radio frequency integrated circuit (RFIC) 204.

Figure 6:
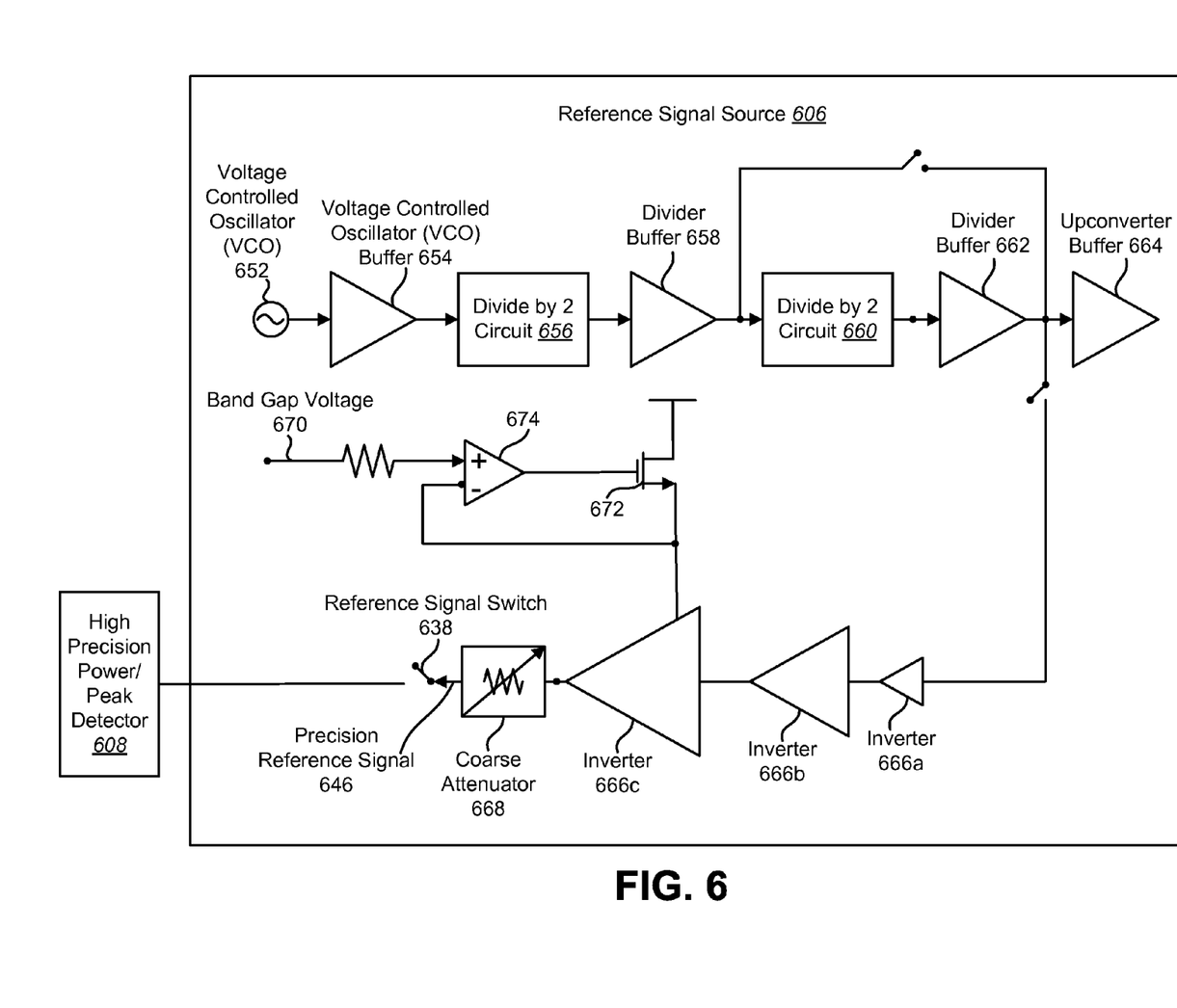
FIG. 6 is a block diagram illustrating a reference signal source for use in the present systems and methods.

FIG. 6 is a block diagram illustrating a reference signal source 606 for use in the present systems and methods. The reference signal source 606 of FIG. 6 may be one configuration of the reference signal source 106 of FIG. 1. The reference signal source 606 may be located on the same radio frequency integrated circuit (RFIC) 104 as a high precision power/peak detector 608. The reference signal source 606 may be used to generate a precision reference signal 646 that is used to calibrate the high precision power/peak detector 608.

The reference signal source 606 may include a voltage controlled oscillator (VCO) 652. The voltage controlled oscillator (VCO) 652 may be coupled to a voltage controlled oscillator (VCO) buffer 654. The output of the voltage controlled oscillator (VCO) buffer 654 may be coupled to a divide by 2 circuit 656. The output of the divide by 2 circuit 656 may be passed through a first divider buffer 658. The output of the first divider buffer 658 may be passed through a divide by 2 circuit 660 and a second divider buffer 662. The output of the second divider buffer 662 may be provided to an upconverter buffer 664 as part of a local oscillator path. A switch may be used to provide the output of the first divider buffer 658 to the upconverter buffer 664 as necessary.

A signal from the local oscillator (e.g., from the output of the second divider buffer 662) may be tapped off using a switch and a chain of inverters 666a-b that are used to drive a final inverter 666c. The chain of inverters 666 may include a small inverter 666a. The output of the small inverter 666a may be coupled to a larger inverter 666b. The output of the larger inverter 666b may be coupled to the final inverter 666c. The final inverter 666c may be much larger than the small inverter 666a and the larger inverter 666b. The final inverter 666c may be supplied with a well regulated supply.

The well regulated supply may include a band gap voltage 670 that is applied to the positive input of an op-amp 674 via a resistor. The negative input of the op-amp 674 may be coupled to the supply of the final inverter 666c. The output of the op-amp 674 may be coupled to the gate of an N-channel transistor 672. The drain of the N-channel transistor 672 may be coupled to a supply voltage. The source of the N-channel transistor 672 may be coupled to the supply of the final inverter 666c.

The output of the final inverter 666c may provide a precision reference signal 646 (i.e. a power reference) that is well controlled with respect to process and frequency. In other words, the precision reference signal 646 may be a precise signal that is independent of process, temperature and frequency. The precision reference signal 646 can be controlled in fine steps by controlling the supply voltage of the final inverter 666c. The precision reference signal 646 can be controlled in coarse steps by a variable coarse attenuator 668 coupled to the output of the final inverter 666c. The temperature dependence of the precision reference signal 646 may be predictable (and hence can be calibrated out numerically based on the measured temperature). The precision reference signal 646 may be provided to the high precision power/peak detector 608 via a reference signal switch 638.

Figure 7:
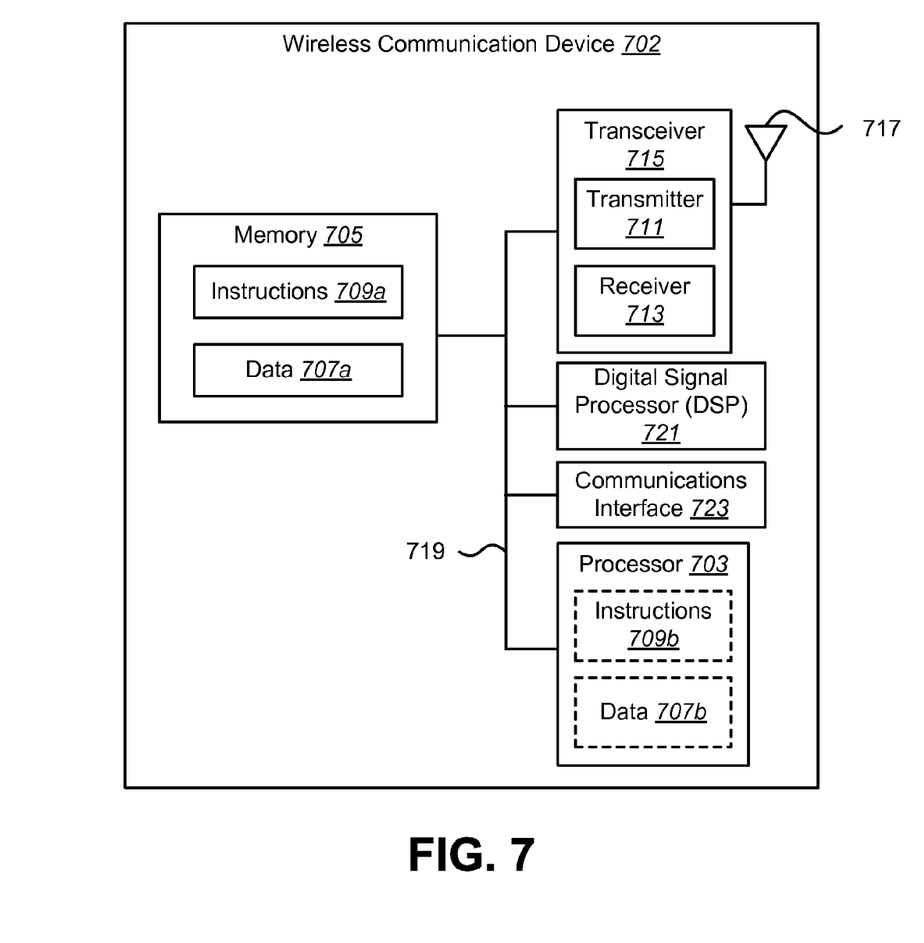
FIG. 7 illustrates certain components that may be included within a wireless communication device.

FIG. 7 illustrates certain components that may be included within a wireless communication device 702. The wireless communication device 702 may be an access terminal, a mobile station, a user equipment (UE), etc. The wireless communication device 702 includes a processor 703. The processor 703 may be a general purpose single- or multi-chip microprocessor (e.g., an ARM), a special purpose microprocessor (e.g., a digital signal processor (DSP)), a microcontroller, a programmable gate array, etc. The processor 703 may be referred to as a central processing unit (CPU). Although just a single processor 703 is shown in the wireless communication device 702 of FIG. 7, in an alternative configuration, a combination of processors (e.g., an ARM and DSP) could be used.

The wireless communication device 702 also includes memory 705. The memory 705 may be any electronic component capable of storing electronic information. The memory 705 may be embodied as random access memory (RAM), read-only memory (ROM), magnetic disk storage media, optical storage media, flash memory devices in RAM, on-board memory included with the processor, EPROM memory, EEPROM memory, registers and so forth, including combinations thereof.

Data 707a and instructions 709a may be stored in the memory 705. The instructions 709a may be executable by the processor 703 to implement the methods disclosed herein. Executing the instructions 709a may involve the use of the data 707a that is stored in the memory 705. When the processor 703 executes the instructions 709, various portions of the instructions 709b may be loaded onto the processor 703, and various pieces of data 707b may be loaded onto the processor 703.

The wireless communication device 702 may also include a transmitter 711 and a receiver 713 to allow transmission and reception of signals to and from the wireless communication device 702 via an antenna 717. The transmitter 711 and receiver 713 may be collectively referred to as a transceiver 715. The wireless communication device 702 may also include (not shown) multiple transmitters, multiple antennas, multiple receivers and/or multiple transceivers.

The wireless communication device 702 may include a digital signal processor (DSP) 721. The wireless communication device 702 may also include a communications interface 723. The communications interface 723 may allow a user to interact with the wireless communication device 702.

The various components of the wireless communication device 702 may be coupled together by one or more buses, which may include a power bus, a control signal bus, a status signal bus, a data bus, etc. For the sake of clarity, the various buses are illustrated in FIG. 7 as a bus system 719.

Figure 8:
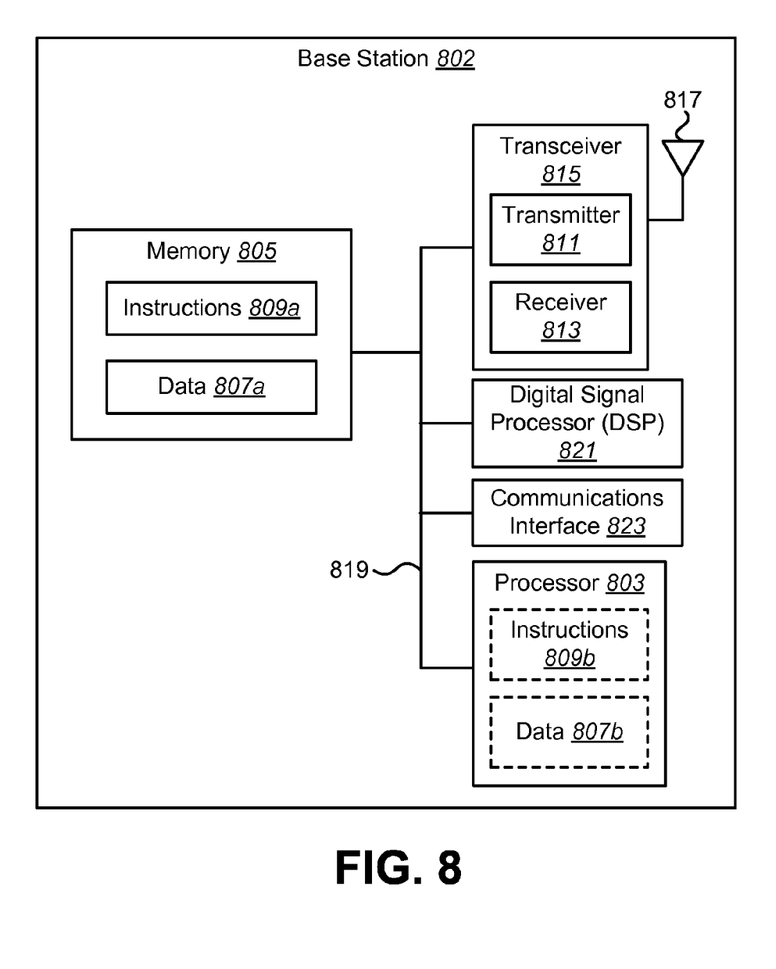
FIG. 8 illustrates certain components that may be included within a base station.

FIG. 8 illustrates certain components that may be included within a base station 802. The base station 802 of FIG. 8 may be one configuration of the wireless device 102 of FIG. 1. A base station 802 may also be referred to as, and may include some or all of the functionality of, an access point, a broadcast transmitter, a NodeB, an evolved NodeB, etc. The base station 802 includes a processor 803. The processor 803 may be a general purpose single- or multi-chip microprocessor (e.g., an ARM), a special purpose microprocessor (e.g., a digital signal processor (DSP)), a microcontroller, a programmable gate array, etc. The processor 803 may be referred to as a central processing unit (CPU). Although just a single processor 803 is shown in the base station 802 of FIG. 8, in an alternative configuration, a combination of processors (e.g., an ARM and DSP) could be used.

The base station 802 also includes memory 805. The memory 805 may be any electronic component capable of storing electronic information. The memory 805 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 807a and instructions 809a may be stored in the memory 805. The instructions 809a may be executable by the processor 803 to implement the methods disclosed herein. Executing the instructions 809a may involve the use of the data 807a that is stored in the memory 805. When the processor 803 executes the instructions 809a, various portions of the instructions 809b may be loaded onto the processor 803, and various pieces of data 807b may be loaded onto the processor 803.

The base station 802 may also include a transmitter 811 and a receiver 813 to allow transmission and reception of signals to and from the base station 802. The transmitter 811 and receiver 813 may be collectively referred to as a transceiver 815. An antenna 817 may be electrically coupled to the transceiver 815. The base station 802 may also include (not shown) multiple transmitters, multiple receivers, multiple transceivers and/or multiple antennas.

The base station 802 may include a digital signal processor (DSP) 821. The base station 802 may also include a communications interface 823. The communications interface 823 may allow a user to interact with the base station 802.

The various components of the base station 802 may be coupled together by one or more buses, which may include a power bus, a control signal bus, a status signal bus, a data bus, etc. For the sake of clarity, the various buses are illustrated in FIG. 8 as a bus system 819.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer or processor. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio and microwave, then the coaxial cable, fiber optic cable, twisted pair, DSL, or wireless technologies such as infrared, radio and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 3, FIG. 4 and FIG. 5, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods and apparatus described herein without departing from the scope of the claims.

What is claimed is:

1. A wireless device, comprising:
    a high precision power/peak detector;
    a reference signal source, wherein the high precision power/peak detector and the reference signal source are on an integrated circuit, and wherein the reference signal source provides a precision reference signal used to calibrate the high precision power/peak detector; and
    a reference signal switch, wherein the precision reference signal is provided to the high precision power/peak detector via the reference signal switch.

2. The wireless device of claim 1, wherein the integrated circuit is a radio frequency integrated circuit.

3. The wireless device of claim 1, further comprising:
    a power amplifier; and
    a coupler, wherein the coupler is coupled to an output of the power amplifier, and wherein the coupler provides a feedback signal to the high precision power/peak detector.

4. The wireless device of claim 1, wherein the reference signal switch allows the high precision power/peak detector to receive the precision reference signal only during calibration.

5. The wireless device of claim 1, wherein the high precision power/peak detector is calibrated to measure absolute power at an input.

6. The wireless device of claim 1, wherein the precision reference signal is independent of process, temperature and frequency.

7. The wireless device of claim 1, wherein the high precision power/peak detector is used to detect an output power of the integrated circuit.

8. The wireless device of claim 1, wherein the high precision power/peak detector is used to detect a rejection of a duplexer on the wireless device in a Rx band.

9. The wireless device of claim 1, wherein the high precision power/peak detector is used to detect a rejection of a power amplifier on the wireless device in a Rx band.

10. The wireless device of claim 1, wherein the high precision power/peak detector is used to predict Rx band noise at an input of a low noise amplifier on the wireless device.

11. The wireless device of claim 1, wherein the high precision power/peak detector is used to modify a configuration of the wireless device to enable lower current consumption of the wireless device.

12. The wireless device of claim 1, wherein the high precision power/peak detector is calibrated by setting the wireless device to a maximum power and measuring a feedback signal using the high precision power/peak detector and a housekeeping analog-to-digital converter.

13. The wireless device of claim 1, wherein the wireless device is a wireless communication device.

14. The wireless device of claim 1, wherein the wireless device is a base station.

15. A method for measuring power on a wireless device, the method comprising:
    adjusting a reference signal switch to provide a precision reference signal to a high precision power/peak detector, wherein the precision reference signal is generated by a reference signal source, and wherein the reference signal source and the high precision power/peak detector are located on an integrated circuit;
    calibrating the high precision power/peak detector using the precision reference signal; and
    measuring a feedback signal using the high precision power/peak detector.

16. The method of claim 15, further comprising:
    adjusting the reference signal switch to stop providing the precision reference signal to the high precision power/peak detector;
    adjusting a transmit chain feedback switch to provide transmit chain feedback from the high precision power/peak detector to a transmit chain; and
    optimizing the transmit chain based on the transmit chain feedback.

17. The method of claim 15, wherein measuring a feedback signal comprises:
    generating a transmit signal;
    amplifying the transmit signal using a power amplifier;
    providing a feedback signal to the high precision power/peak detector; and
    obtaining transmit chain metrics using the high precision power/peak detector.

18. The method of claim 15, wherein the method is performed by a wireless device comprising:
    the high precision power/peak detector; and
    the reference signal source, wherein the integrated circuit is a radio frequency integrated circuit.

19. The method of claim 18, wherein the wireless device further comprises:
    a power amplifier; and
    a coupler, wherein the coupler is coupled to an output of the power amplifier, and wherein the coupler provides a feedback signal to the high precision power/peak detector.

20. The method of claim 18, wherein the precision reference signal is provided to the high precision power/peak detector via a reference signal switch.

21. The method of claim 18, wherein the high precision power/peak detector is calibrated to measure absolute power at an input.

22. The method of claim 18, wherein the precision reference signal is independent of process, temperature and frequency.

23. The method of claim 18, wherein the high precision power/peak detector is used to detect an output power of the integrated circuit.

24. The method of claim 18, wherein the high precision power/peak detector is used to detect a rejection of a duplexer on the wireless device in a Rx band.

25. The method of claim 18, wherein the high precision power/peak detector is used to detect a rejection of a power amplifier on the wireless device in a Rx band.

26. The method of claim 18, wherein the high precision power/peak detector is used to predict Rx band noise at an input of a low noise amplifier on the wireless device.

27. The method of claim 18, wherein the high precision power/peak detector is used to modify a configuration of the wireless device to enable lower current consumption of the wireless device.

28. The method of claim 18, wherein the high precision power/peak detector is calibrated by setting the wireless device to a maximum power and measuring a feedback signal using the high precision power/peak detector and a housekeeping analog-to-digital converter.

29. The method of claim 18, wherein the wireless device is a wireless communication device.

30. The method of claim 18, wherein the wireless device is a base station.

31. An apparatus comprising:
   means for adjusting a reference signal switch to provide a precision reference signal to a high precision power/peak detector, wherein the precision reference signal is generated by a reference signal source, and wherein the reference signal source and the high precision power/peak detector are located on an integrated circuit;
   means for calibrating the high precision power/peak detector using the precision reference signal; and
   means for measuring a feedback signal using the high precision power/peak detector.

32. The apparatus of claim 31, further comprising:
   means for adjusting the reference signal switch to stop providing the precision reference signal to the high precision power/peak detector;
   means for adjusting a transmit chain feedback switch to provide transmit chain feedback from the high precision power/peak detector to a transmit chain; and
   means for optimizing the transmit chain based on the transmit chain feedback.

33. The apparatus of claim 31, wherein the means for measuring a feedback signal comprise:
   means for generating a transmit signal;
   means for amplifying the transmit signal;
   means for providing a feedback signal to the high precision power/peak detector; and
   means for obtaining transmit chain metrics.

34. A non-transitory computer-readable medium having instructions thereon, the instructions comprising:
   code for causing a wireless device to adjust a reference signal switch to provide a precision reference signal to a high precision power/peak detector, wherein the precision reference signal is generated by a reference signal source, and wherein the reference signal source and the high precision power/peak detector are located on an integrated circuit;
   code for causing the wireless device to calibrate the high precision power/peak detector using the precision reference signal; and
   code for causing the wireless device to measure a feedback signal using the high precision power/peak detector.

35. The non-transitory computer-readable medium of claim 34, further comprising:
   code for causing the wireless device to adjust the reference signal switch to stop providing the precision reference signal to the high precision power/peak detector;
   code for causing the wireless device to adjust a transmit chain feedback switch to provide transmit chain feedback from the high precision power/peak detector to a transmit chain; and
   code for causing the wireless device to optimize the transmit chain based on the transmit chain feedback.

36. The non-transitory computer-readable medium of claim 34, wherein the code for causing the wireless device to measure a feedback signal comprises:
   code for causing the wireless device to generate a transmit signal;
   code for causing the wireless device to amplify the transmit signal using a power amplifier;
   code for causing the wireless device to provide a feedback signal to the high precision power/peak detector; and
   code for causing the wireless device to obtain transmit chain metrics using the high precision power/peak detector.

* * * * *